Aug. 21, 1962
R. M. EVERSOLE
3,050,612
DESOLDERING TIP
Filed Oct. 26, 1960
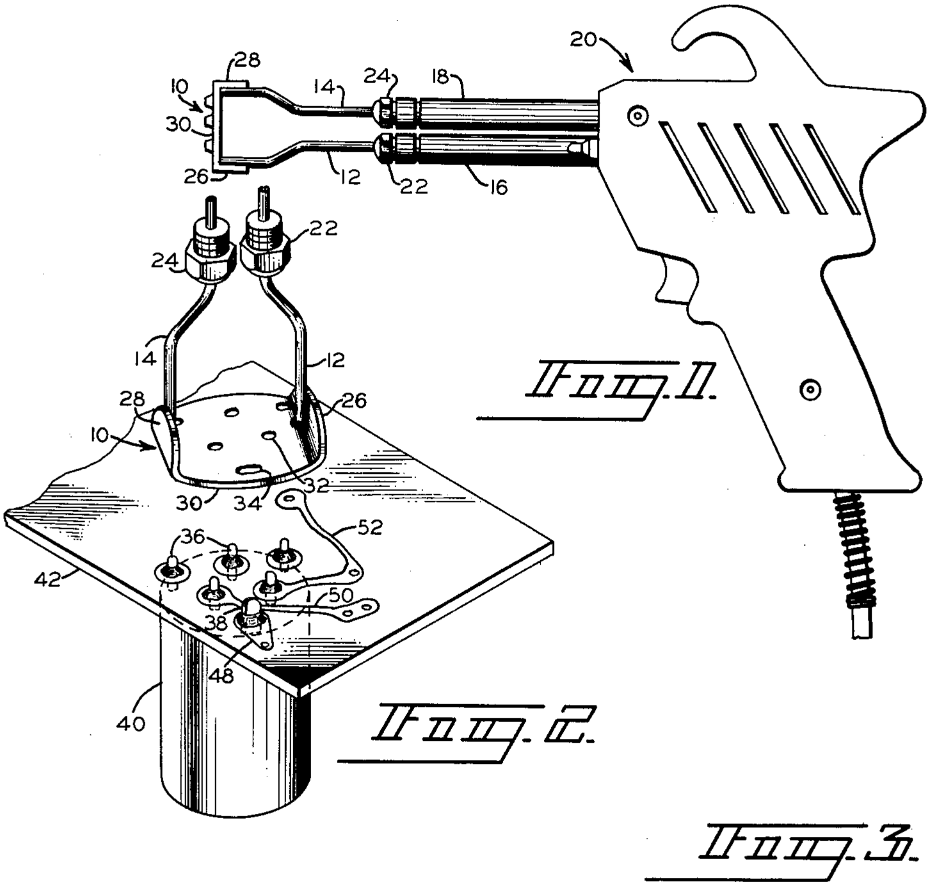
FIG. 1, FIG. 2
FIG. 3
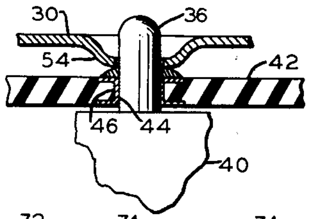
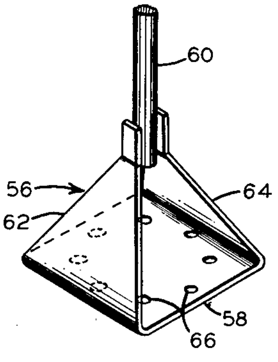
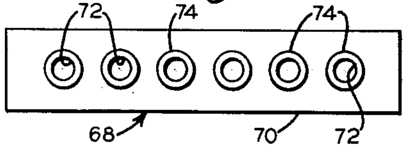
FIG. 4
FIG. 5
*INVENTOR.*
RALPH M. EVERSOLE
*BY* Owen + Owen
ATTORNEYS United States Patent Office 3,050,612
Patented Aug. 21, 1962

3,050,612
DESOLDERING TIP

Ralph M. Eversole, Rte. 5, Fremont, Ohio

Filed Oct. 26, 1960, Ser. No. 65,198
4 Claims. (Cl. 219—26)

This invention relates to a desoldering tip for soldering irons or guns and more particularly to a desoldering tip especially adapted to remove electrical components which have been soldered to a printed circuit board.

Printed circuits have many advantages over conventional wired circuits and are now used extensively in many electronic applications. However, one disadvantage of printed circuits is that it is difficult to remove electrical components which are soldered or similarly connected to a printed circuit board. Desoldering tips to remove electrical components for repalcement or repair are known in the art; however, these tips either desolder only one contact of the component at a time or tend to damage the printed circuit board at those portions lying between the contacts. Other tips accomplish the desoldering operation by applying heat through the contacts or pins of the component, rather than directly to the solder. While desoldering tips capable of desoldering only one contact at a time are suitable for resistors, capacitors, etc. having flexible leads, they are not suitable for desoldering electrical components, such as most vacuum tubes, for example, having a plurality of contacts or pins which are associated with one another in such a manner that they can only move together as a unit. In such components, when the solder is melted at only one contact at a time, it resolidifies and re-adheres the contact to the board while solder at other contacts is being melted.

The new desoldering tip according to the invention is capable of desoldering a plurality of contacts of an electrical component at one time and of doing so without injury to the printed circuit board. The new tip includes an elecrtically conducting plate having a plurality of openings therein arranged in a pattern corresponding to the pattern of the contacts of the component which is to be removed from a printed circuit board. At least one rigid arm member extends outwardly from one side of the plate and is connected to a soldering gun or similar device to supply heat to the plate. On the opposite side of the plate are projections, one of which is located adjacent each of the openings and preferably encircles the opening so as to provide maximum contact with the solder which is solidified around each contact or pin of the electrical component.

With the new tip, all of the contacts or pins of a component are desoldered simultaneously so that the component can be removed very quickly from the printed circuit board. Further, the projections enable the tip to contact the solder with the rest of the heated plate being maintained in spaced relationship with respect to the printed circuit board so that the board will not be damaged by heat from the plate. It is important that the projections contact the solder directly rather than contacting and heating the pins and conducting heat through them to the solder.

It is, therefore, a principal object of the invention to provide a desoldering tip capable of quickly desoldering from a printed circuit board the contacts of an electrical component, whose contacts are in fixed relationship, one with respect to another.

Another object of the invention is to provide a desoldering tip for an existing soldering gun or iron which will enable quick removal of all of the soldered connections of an electronic component from a printed circuit board by the direct application of heat to the solder alone, so that the board and printed connections remain cool and undamaged.

Other objects and advantages of the invention will be apparent from the following detailed description of a preferred embodiment thereof, reference being made to the accompanying drawing, in which:

FIG. 1 is a side view of an electrical soldering device having a desoldering tip embodying the present invention;

FIG. 2 is a view in perspective of the soldering tip shown in FIG. 1, a printed circuit board, and an electrical component soldered to the board;

FIG. 3 is a greatly enlarged, fragmentary view in cross section of the soldering tip, printed circuit board, and electrical component shown in FIG. 2, but with the tip now in contact with the solder which is to be melted;

FIG. 4 is a view in perspective of a slightly modified desoldering tip embodying the principles of the invention; and FIG. 5 is a bottom view of a modified desoldering tip.

Referring to the drawing, and more particularly to FIGS. 1 and 2, a desoldering tip according to the invention is shown at 10 and includes two rigid, electrically conducting arms 12 and 14 which are connected to terminal legs 16 and 18 of a conventional soldering gun 20. The electrical connection between the tip 10 and the gun 20 will vary for different styles of guns but, in the present instance, the two arms 12 and 14 are provided with coupling nuts 22 and 24 which mechanically and electrically connect the arms 12 and 14 to the terminal legs 16 and 18.

The arms 12 and 14 of the tip 10 are welded or otherwise suitably affixed to terminal or end plates 26 and 28 which are connected in spaced relationship to a main conducting plate 30. The terminal plates 26 and 28 preferably are part of the main plate 30 and are simply formed by bending up portions of the plate 30. However, the terminal plates can be separate from the main plate 30 and can be silver soldered or otherwise affixed thereto. In any case, the terminal plates provide a wide low resistance path over the plate 30 for current to flow so that the plate 30 will be heated uniformly. The plate 30 includes a plurality of openings 32 and 34 which are arranged in a predetermined pattern corresponding to the pattern of electrical contacts or pins of an electrical component which is to be removed from a printed circuit board. In the present instance, the openings 32 and 34 are arranged in a triangular pattern which corresponds to the pattern formed by a plurality of contacts or pins 36 and 38 of an electrical component 40 which is soldered to a printed circuit board 42. The electrical connection to the board is made by inserting the contacts, such as the contact 36 of FIG. 3, through a preformed opening 44 in the board 42 and by soldering the contacts 36 on the opposite side of the board 42. The openings 44 are coated or lined with a layer 46 of copper or other conducting material to provide a good electrical connection with the contacts soldered in the holes and to electrically connect them to the printed conducting layers or strips such as strips 48, 50, and 52 (FIG. 2) which provide electrical paths to connect the component 40 with other circuit elements or components which are also mounted on the printed circuit board.

Each of the openings 32 and 34 in the heated plate 30 has an adjacent projection 54 (FIG. 3) which extends beyond the plane of the plate 30 on the side opposite the connecting arms 12 and 14. When the plate 30 is placed over a connecting pin in surrounding relation thereto the projection 54 contacts the solder at the opening 44 and melts the solder thereat when the plate 30 is heated to sufficient temperature. Heat is applied to the solder only at an area immediately adjacent the opening 44 while the rest of the desoldering plate 30 is maintained in spaced relationship with respect to the surface of the board. Hence, the solder adjacent the contacts 36 and the opening 44 is melted without doing any damage to the board itself. Of course, all of the solder at all contacts is melted at the same time when the plate 30 is lowered over the contacts 36 and 38 with the projections 54 in contact with the solder.

The projections 54 need not completely encompass or surround the openings 32 and 34 but preferably do so to provide maximum contact with solder around the contacts 36. The projections 54 also directly contact the solder rather than engaging the contact pins 36 and melting the solder by conducting heat through the pins 36 to the solder. Melting is thus effected more rapidly with the new tip while keeping the temperature of the contacts or pins 36 as low as possible.

Referring to FIG. 4, a desoldering tip 56 is designed specifically for use with a soldering iron which heats a main plate 58 by thermal rather than electrical conduction. In this instance, the tip 56 has a single, rigid arm 60 which is received in the end of a conventional soldering iron and which conducts heat from the iron heating element to end plates 62 and 64 and, hence, to the main plate 58. As shown, the main plate 58 contains holes 66 to receive contacts of an electrical component, which holes are arranged in an appropriate pattern such as a circular pattern and have projections on their lower surface which are similar to the projections 54 of the plate 30.

Referring to FIG. 5, a modified tip 68 includes an elongate plate or strip 70 which has a plurality of holes 72 arranged in a row. This pattern is particularly suitable for desoldering connections of terminal strips. Each of the holes 72 has an annular projection 74 for contacting solder at the terminals.

Various modifications of the above described embodiment of the invention will be apparent to those skilled in the art, and it is to be understood that such modifications can be made without departing from the scope of the invention, if within the scope and spirit of the accompanying claims.

I claim:

1. A desoldering tip for melting solder or other low melting joining metal used to connect electrically an electrical component having a plurality of contacts arranged in a predetermined pattern to a printed circuit board, said tip comprising a thin main plate, said plate having a plurality of unobstructed openings arranged in positions corresponding to positions of the contacts of the electrical component, said openings being slightly larger than said contacts to receive the same, said plate forming a projection adjacent each of said openings, said projections extending outwardly from a common side of the plate, and connecting means connected to the side of said plate opposite the projections for heating said plate to a temperature at which the joining metal will melt.

2. A desoldering tip according to claim 1 wherein said projections are part of said main plate and curve outwardly therefrom.

3. A desoldering tip for melting solder or other low melting joining metal used to connect electrically an electrical component having a plurality of contacts arranged in a predetermined pattern to a printed circuit board, said tip comprising a main plate, a pair of spaced end plates affixed to said main plate and extending outwardly therefrom, at least one rigid arm for connecting said end plates with a soldering device, said main plate having a plurality of openings arranged in a pattern corresponding to a pattern of the contacts of the electrical component and being located between said end plates, and said main plate having a projection circumferentially around each of said openings and extending outwardly from said main plate on the side opposite said spaced flanges.

4. A desoldering tip for melting solder or other low melting joining metal used to connect electrically an electrical component having a plurality of contacts arranged in a predetermined pattern to a printed circuit board, said tip comprising a main plate, said plate having a plurality of unobstructed openings arranged in positions corresponding to positions of the contacts of the electrical component, said openings being slightly larger than said contacts to receive the same, said plate forming a projection adjacent each of said openings, said projections extending outwardly from a common side of the plate, a pair of arms connected to spaced portions of said plate and extending outwardly from the side thereof opposite the projections, and means on said arms for making electrical connections with a soldering gun.

References Cited in the file of this patent

UNITED STATES PATENTS

| | | |
|---|---|---|
| 2,293,455 | Disch et al | Aug. 18, 1942 |
| 2,429,836 | McFarlane | Oct. 28, 1947 |
| 2,612,128 | Warsaw | Sept. 30, 1952 |
| 2,796,507 | Young | June 18, 1957 |

OTHER REFERENCES

"Soldering Iron Tip," W. J. Richardson, IBM Technical Disclosure Bulletin, vol. 1, No. 2, August 1958, p. 18.